United States Patent
Yun et al.

(10) Patent No.: US 12,515,294 B2
(45) Date of Patent: Jan. 6, 2026

(54) POLISHING PAD WITH ADJUSTED CROSSLINKING DEGREE AND PROCESS FOR PREPARING THE SAME

(71) Applicant: ENPULSE CO., LTD., Chungcheongnam-Do (KR)

(72) Inventors: Jong Wook Yun, Gyeonggi-do (KR); Eun Sun Joeng, Ulsan (KR); Jang Won Seo, Gyeonggi-do (KR)

(73) Assignee: ENPULSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/002,386

(22) Filed: Aug. 25, 2020

(65) Prior Publication Data

US 2021/0129284 A1 May 6, 2021

(30) Foreign Application Priority Data

Oct. 30, 2019 (KR) .................. 10-2019-0136303

(51) Int. Cl.
*B24B 37/24* (2012.01)
*B24D 11/00* (2006.01)
*H01L 21/306* (2006.01)

(52) U.S. Cl.
CPC .......... *B24B 37/24* (2013.01); *B24D 11/003* (2013.01); *H01L 21/30625* (2013.01)

(58) Field of Classification Search
CPC .. B24B 37/24; B24D 11/003; H01L 21/30625
See application file for complete search history.

(56) References Cited

U.S. PATENT DOCUMENTS

| | | | | |
|---|---|---|---|---|
| 7,217,179 B2* | 5/2007 | Sakurai | ..................... | B24B 7/04 451/526 |
| 7,488,236 B2* | 2/2009 | Shimomura | ............. | B24D 3/30 451/41 |
| 7,922,783 B2* | 4/2011 | Sakurai | .................. | B24D 3/342 451/526 |
| 2008/0139684 A1* | 6/2008 | Swisher | ................ | C08G 18/10 521/170 |

(Continued)

FOREIGN PATENT DOCUMENTS

| CN | 101501112 A | 8/2009 |
|---|---|---|
| JP | 2005-126658 A | 5/2005 |

(Continued)

OTHER PUBLICATIONS

Office Action issued by Taiwanese Patent Office on Aug. 17, 2021

(Continued)

*Primary Examiner* — Pegah Parvini
(74) *Attorney, Agent, or Firm* — IP & T GROUP LLP

(57) ABSTRACT

The polishing pad according to an embodiment comprises a multifunctional low-molecular-weight compound as one of the polymerization units of the polyurethane-based resin that constitutes the polishing layer, thereby reducing the unreacted diisocyanate monomer in the production process to enhance the processability and quality and to increase the crosslinking density. Thus, the polishing pad may be applied to a process of preparing a semiconductor device, which comprises a CMP process, to provide a semiconductor device such as a wafer of excellent quality.

5 Claims, 1 Drawing Sheet

(56) References Cited

U.S. PATENT DOCUMENTS

| | | | |
|---|---|---|---|
| 2014/0120809 A1 | 5/2014 | Qian et al. | |
| 2014/0342641 A1* | 11/2014 | Shimizu | B24D 11/001 451/41 |
| 2017/0291275 A1* | 10/2017 | Kadowaki | C08G 18/6607 |
| 2018/0339393 A1* | 11/2018 | Ahn | B24B 37/22 |
| 2018/0345448 A1 | 12/2018 | Weis et al. | |

FOREIGN PATENT DOCUMENTS

| | | |
|---|---|---|
| JP | 2008238261 A | 10/2008 |
| JP | 6513455 B2 | 5/2019 |
| KR | 10-2009-0123852 A | 12/2009 |
| KR | 10-2016-0027075 | 3/2016 |
| TW | 201338922 A | 10/2013 |
| TW | 201922834 A | 6/2019 |

OTHER PUBLICATIONS

Office Action issued by the Korean Patent Office on Jan. 15, 2021.
Office Action issued by the Japanese Patent Office on Oct. 5, 2021.
Office Action issued by the Singaporean Patent Office on Jun. 23, 2021.

* cited by examiner

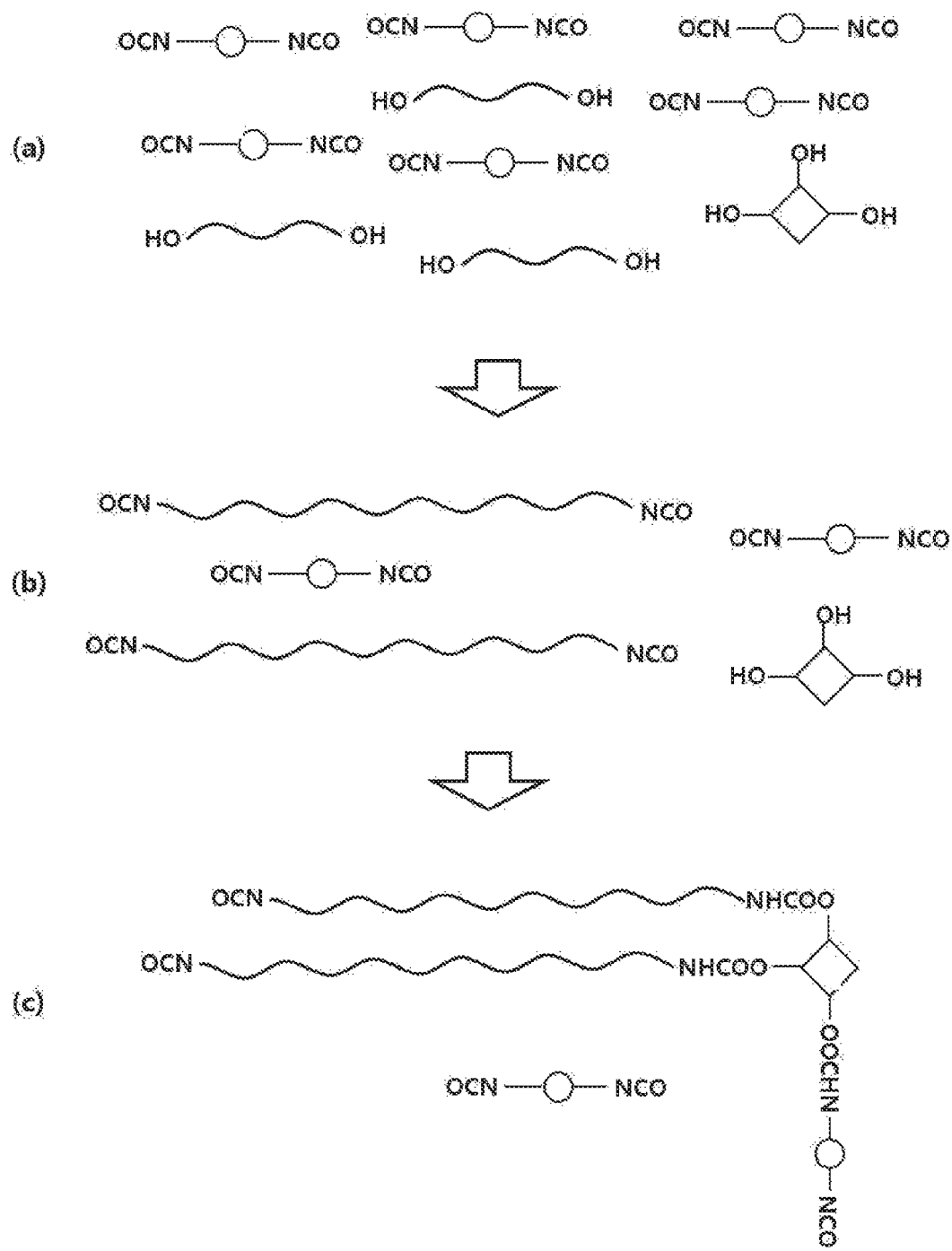

POLISHING PAD WITH ADJUSTED CROSSLINKING DEGREE AND PROCESS FOR PREPARING THE SAME

The present application claims priority of Korean patent application number 10-2019-0136303 filed on Oct. 30, 2019 which is incorporated herein by reference in its entirety.

TECHNICAL FIELD

Embodiments relate to a polishing pad with an adjusted crosslinking degree and a process for preparing the same. More specifically, the embodiments relate to a polishing to pad whose crosslinking density is adjusted to have characteristics and performance applicable to a chemical mechanical planarization (CMP) process, a process for preparing the same, and a process for preparing a semiconductor device by using the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad is composed of a polyurethane-based resin, which is prepared from a composition comprising a prepolymer obtained by reacting a diisocyanate and a polyol, a curing agent, a foaming agent, and the like (see Korean Laid-open Patent Publication No. 2016-0027075).

In addition, a polishing pad is provided on its surface with grooves for a large flow of a slurry and pores for supporting a fine flow thereof. The pores may be formed by using a solid phase foaming agent having voids, an inert gas, a liquid phase material, a so fiber, or the like, or by generating a gas by a chemical reaction.

DISCLOSURE OF INVENTION

Technical Problem

The performance of a polishing pad used in the CMP process is known to be affected by the composition of a polyurethane resin that constitutes the polishing pad, the diameter of micropores, and such physical properties as hardness, tensile strength, and elongation of the polishing pad. In particular, the bonding units formed by crosslinking, among various chemical structures formed through the preparation and curing reaction of a urethane-based prepolymer, have a significant impact on the physical properties of a polishing pad. In addition, the urethane-based prepolymer varies in its characteristics and physical properties with the unreacted monomers remaining therein. This has a huge impact on the performance of the CMP process.

Specifically, the unreacted diisocyanate monomer present in a urethane-based prepolymer unnecessarily shortens the gelation time in the curing step for the production of a polishing pad, thereby making the process control difficult and deteriorating the quality of the final polishing pad. However, if the amount of diisocyanate in the raw material is lowered to reduce the unreacted diisocyanate monomer, the mechanical properties such as hardness and tensile strength of the final polishing pad may also be deteriorated, thereby impairing the performance of the polishing pad.

As a result of the research conducted by the present inventors, it has been discovered that a certain amount of a multifunctional low-molecular-weight compound contained in the raw material in the production process of a polishing pad increases the crosslinking density while reducing the content of the unreacted diisocyanate monomer in the urethane-based prepolymer, thereby enhancing the mechanical properties.

Accordingly, an object of the embodiments is to provide a polishing pad whose crosslinking density is adjusted to have characteristics and performance applicable to a CMP process, a process for preparing the same, and a process for preparing a semiconductor device by using the same.

Solution to Problem

According to an embodiment, there is provided a polishing pad, which comprises a polishing layer comprising a polyurethane-based resin, wherein the polyurethane-based resin comprises a diisocyanate, a polyol, and a multifunctional low-molecular-weight compound as polymerization units, the multifunctional low-molecular-weight compound has a molecular weight of 500 or less, and the polishing layer has a swelling ratio of 100% to 250% in dimethyl sulfoxide based on the volume or weight of the polishing layer.

According to another embodiment, there is provided a process for preparing a polishing pad, which comprises reacting a diisocyanate, a polyol, and a multifunctional low-molecular-weight compound to prepare a urethane-based prepolymer; and mixing the urethane-based prepolymer with a curing agent and a foaming agent and curing the mixture to prepare a polishing layer, wherein the multifunctional low-molecular-weight compound has a molecular weight of 500 or less, and the polishing layer has a swelling ratio of 100% to 250% in dimethyl sulfoxide based on the volume or weight of the polishing layer.

According to still another embodiment, there is provided a process for preparing a semiconductor device, which comprises polishing the surface of a semiconductor substrate using a polishing pad, wherein the polishing pad comprises a polishing layer comprising a polyurethane-based resin, the polyurethane-based resin comprises a diisocyanate, a polyol, and a multifunctional low-molecular-weight compound as polymerization units, the multifunctional low-molecular-weight compound has a molecular weight of 500 or less, and the polishing layer has a swelling ratio of 100% to 250% in dimethyl sulfoxide based on the volume or weight of the polishing layer.

Advantageous Effects of Invention

The polishing pad according to an embodiment comprises a multifunctional low-molecular-weight compound as a polymerization unit of the polyurethane-based resin that constitutes the polishing layer, thereby reducing the unreacted diisocyanate monomer in the production process to enhance the processability and quality and to increase the crosslinking density. Thus, the polishing pad may be applied to a process for preparing a semiconductor device, which comprises a CMP process, to provide a semiconductor device such as a wafer of excellent quality.

BRIEF DESCRIPTION OF DRAWINGS

FIG. 1 schematically shows that a multifunctional low-molecular-weight compound is combined with an unreacted diisocyanate monomer while linking the polymerization chains in the reaction of a urethane-based prepolymer for preparing a polishing pad according to an embodiment.

BEST MODE FOR CARRYING OUT THE INVENTION

Throughout the description of the embodiments, in the case where an element is mentioned to be formed on or under another element, it means not only that the element is directly formed on or under another element, but also that the element is indirectly formed on or under another element with other element(s) interposed between them.

In this specification, when a part is referred to as "comprising" an element, it is to be understood that it may comprise other elements as well, rather than excluding the other elements, unless specifically stated otherwise.

In addition, all numerical ranges related to the physical properties, dimensions, and the like of a component used herein are to be understood as being modified by the term "about," unless otherwise indicated.

In this specification, singular forms are to be interpreted in the context of the singular or plural forms, unless the context describes otherwise.

In this specification, the "polymerization unit" is a monomer, an oligomer, or an additive used in the process of preparing a corresponding polymer or prepolymer. It refers to a compound that participates in constituting a polymerization chain or a unit derived therefrom and actually constituting the polymerization chain.

[Polishing Pad]

The polishing pad according to an embodiment comprises a polishing layer comprising a polyurethane-based resin, wherein the polyurethane-based resin comprises a diisocyanate, a polyol, and a multifunctional low-molecular-weight compound as polymerization units, the multifunctional low-molecular-weight compound has a molecular weight of 500 or less, and the polishing layer has a swelling ratio of 100% to 250% in dimethyl sulfoxide based on the volume or weight of the polishing layer.

Multifunctional Low-Molecular-Weight Compound

The polishing pad according to an embodiment comprises a multifunctional low-molecular-weight compound as one of the polymerization units of the polyurethane-based resin that constitutes the polishing layer, thereby reducing the unreacted diisocyanate monomer in the production process to enhance the processability and quality and to increase the crosslinking density.

FIG. 1 schematically shows that a multifunctional ow-molecular-weight compound is combined with an unreacted diisocyanate monomer while linking the polymerization chains in the reaction of a urethane-based prepolymer for preparing a polishing pad according to an embodiment.

Referring to FIG. 1, (a) first, a diisocyanate, a polyol, and a multifunctional low-molecular-weight compound are mixed as polymerization units, (b) the diisocyanate and the polyol among them form a prepolymer chain, and (c) the multifunctional low-molecular-weight compound may react with the unreacted diisocyanate while linking the prepolymer chains with each other.

Thus, the polyurethane-based resin may comprise the multifunctional low-molecular-weight compound reacted with the diisocyanate; and the polymerization chains crosslinked by the multifunctional low-molecular-weight compound.

The reaction of the diisocyanate and the multifunctional low-molecular-weight compound and the crosslinking reaction include a urethane reaction in which the NCO group and the OH group are reacted to form a urethane group (—NH—C(=O)—O—). In addition, the crosslinking reaction may further include a crosslinking reaction to form allophanate group or a biuret group.

The multifunctional low-molecular-weight compound may comprise one or more compounds having two or more functional groups at the terminal and a molecular weight of 500 or less. For example, the multifunctional low-molecular-weight compound may comprise 3 or more, 3 to 10, 3 to 7, or 3 to 5 functional groups at the terminal.

Specifically, the multifunctional low-molecular-weight compound comprises 3 to functional groups at the terminal, and the functional group may be at least one selected from the group consisting of a hydroxyl group, an amine group, and an epoxy group.

In addition, the multifunctional low-molecular-weight compound may have a molecular weight of 500 or less, 400 or less, 300 or less, 200 or less, 150 or less, or 100 or less. Specifically, the multifunctional low-molecular-weight compound may have a molecular weight of 15 to 500, 30 to 500, 50 to 400, 50 to 300, or 50 to 200.

Specifically, the multifunctional low-molecular-weight compound may comprise at least one selected from the group consisting of glycerin, trimethylolpropane, ethylenediamine, diethanolamine, diethylenetriamine, triethylenetetraamine, and dihydrogen monoxide.

The urethane-based prepolymer may comprise the multifunctional low-molecular-weight compound in an amount of 0.1% to 10% by weight, specifically 0.1% to 5% by weight, based on the weight of the urethane-based prepolymer. More specifically, the content of the multifunctional low-molecular-weight compound in the urethane-based prepolymer may be 0.1% to 3% by weight, 0.1% to 2% by weight, 2% to 5% by weight, or 3% to 5% by weight.

Polyurethane-Based Resin

The polyurethane-based resin that constitutes the polishing layer comprises the diisocyanate, the polyol, and the multifunctional low-molecular-weight compound.

The diisocyanate may be at least one aromatic diisocyanate and/or at least one aliphatic diisocyanate. For example, it may be at least one selected from the group consisting of toluene diisocyanate (TDI), naphthalene-1,5-diisocyanate, p-phenylene diisocyanate, tolidine diisocyanate, diphenylmethane diisocyanate (MDI), hexamethylene diisocyanate (HDI), dicyclohexylmethane diisocyanate (H12MDI), and isophorone diisocyanate.

As a specific example, the diisocyanate comprises at least one aromatic diisocyanate, and the at least one aromatic diisocyanate comprises toluene 2,4-diisocyanate and toluene 2,6-diisocyanate.

As another specific example, the at least one diisocyanate may further comprise at least one aliphatic diisocyanate, and the at least one aliphatic diisocyanate may be diphenylmethane diisocyanate (MDI), hexamethylene diisocyanate (HDI), dicyclohexylmethane diisocyanate (H12MDI), or the like.

The polyol is a conventional polyol widely recognized in the field of the preparation of polyurethane. The polyol may contain one, two, or more hydroxyl groups. It may include oligomers to high-molecular-weight polyols having a certain weight average molecular weight or more. For example, the polyol may include polyether polyols, polyester polyols, polycarbonate polyols, polycaprolactone polyols, and the like. Specifically, a polyether polyol is a compound that contains two or more alkylene ether (or alkylene glycol) repeat units. It may have various sizes that reach an oligomer to a polymer depending on the number of repeats of the alkylene ether units. In addition, the polyol may refer to a composition in which compounds of various sizes are mixed.

In addition, the polyurethane-based resin may comprise one or more diols as a polymerization unit. Specific examples of the diols may include ethylene glycol (EG), diethylene glycol (DEG), propylene glycol (PG), propanediol (PDO), methyl propanediol (MP-diol), and the like.

The weight average molecular weight (Mw) of the polyurethane-based resin may be 500 to 1,000,000, 5,000 to 1,000,000, 50,000 to 1,000,000, 100,000 to 700,000, or 500 to 3,000.

The polyurethane-based resin may be derived from the urethane-based prepolymer. For example, the polyurethane-based resin may be one obtained by curing a urethane-based prepolymer, and the urethane-based prepolymer may comprise the diisocyanate, the polyol, and the multifunctional low-molecular-weight compound as polymerization units.

Specifically, the urethane-based prepolymer may comprise a prepolymerization reaction product of the diisocyanate monomer, the polyol, and the multifunctional low-molecular-weight compound.

The prepolymerization generally refers to a reaction for preparing a polymer having a relatively low molecular weight in which the degree of polymerization is adjusted to an intermediate level for the sake of conveniently molding a product in the process of producing the same. Thus, a prepolymer comprising a prepolymerization reaction product may be molded by itself, or after a further reaction with another polymerizable compound or a curing agent, to form a final product. For example, the weight average molecular weight (Mw) of the urethane-based prepolymer may be 500 to 5,000, 500 to 3,000, 600 to 2,000, or 700 to 1,500.

The urethane-based prepolymer comprises polymerization reactants of various molecular weights between a diisocyanate and a polyol. For example, in the urethane-based prepolymer, the diisocyanate may form a chain in the prepolymer by a reaction of at least one NCO group.

The reaction of the NCO group includes a reaction with a polyol or a side reaction with another compound, but it is not specifically limited. For example, the reaction of the NCO group may include a chain extension reaction. As an example, the reaction of the NCO group includes a urethane reaction in which the NCO group and the OH group are reacted to form a urethane group (—NH—C(=O)—O—) in the course of reacting a diisocyanate and a polyol to prepare the urethane-based prepolymer.

In addition, some of the monomers used in the reaction for preparing the urethane-based prepolymer may not participate in the reaction. Thus, a monomer that has not participated in the reaction may be present in the urethane-based prepolymer. Specifically, the urethane-based prepolymer may comprise an unreacted diisocyanate. In this specification, the "unreacted diisocyanate" refers to a diisocyanate in which the entire NCO groups thereof remain unreacted.

The unreacted diisocyanate present in the urethane-based prepolymer unnecessarily shortens the gelation time in the curing step for the production of a polishing pad, thereby making the process control difficult and deteriorating the quality of the final polishing pad. According to the embodiment, the content of an unreacted diisocyanate in the urethane-based prepolymer may be reduced by the addition of the multifunctional low-molecular-weight compound. As a result, the urethane-based prepolymer may comprise an unreacted diisocyanate in a small amount.

Thus, the urethane-based prepolymer may comprise an unreacted diisocyanate in an amount of 10% by weight or less, 7% by weight or less, 5% by weight or less, 0% by weight to 7% by weight, 1% by weight to 7% by weight, 0% by weight to 5% by weight, 0.1% by weight to 5% by weight, or 1% by weight to 5% by weight, based on the total weight of the diisocyanate. Specifically, the urethane-based prepolymer may comprise an unreacted diisocyanate in an amount of 0.1% by weight to 5% by weight based on the total weight of the diisocyanate. In such event, the unreacted diisocyanate may be an unreacted aromatic diisocyanate.

The urethane-based prepolymer may have an unreacted NCO group at the terminal of a polymer, an oligomer, or a monomer contained therein. As a specific example, the urethane-based prepolymer may comprise an unreacted NCO group in an amount of 5% by weight to 13% by weight, 5% by weight to 10% by weight, 5% by weight to 9% by weight, 6% by weight to 8% by weight, 7% by weight to 9% by weight, or 7% by weight to 8% by weight, based on the weight of the urethane-based prepolymer. As a specific example, the urethane-based prepolymer may comprise an unreacted NCO group in an amount of 5% by weight to 10% by weight based on the weight of the urethane-based prepolymer.

Polishing Layer

The polishing layer comprises the polyurethane-based resin, more specifically, a porous polyurethane-based resin.

That is, the polishing layer may comprise a polyurethane-based resin and a plurality of micropores distributed in the polyurethane-based resin.

The thickness of the polishing layer may be 0.8 mm to 5.0 mm, 1.0 mm to 4.0 mm, 1.0 mm to 3.0 mm, 1.5 min to 2.5 mm, 1.7 mm to 2.3 mm, or 2.0 mm to 2.1 mm.

The specific gravity of the polishing layer may be 0.6 g/cm$^3$ to 0.9 g/cm$^3$ or 0.7 g/cm$^3$ to 0.85 g/cm$^3$.

The hardness of the polishing layer may be 30 Shore D to 80 Shore D, 40 Shore D to 70 Shore D, 50 Shore D to 70 Shore D, 40 Shore D to 65 Shore D, or 55 Shore D to 65 Shore D.

The tensile strength of the polishing layer may be 5 N/mm$^2$ to 30 N/mm$^2$, 10 N/mm$^2$ to 25 N/mm$^2$, 10 N/mm$^2$ to 20 N/mm$^2$, or 15 N/mm$^2$ to 30 N/mm$^2$.

The elongation of the polishing layer may be 50% to 300%, for example, 50% to 150%, 100% to 300%, 150% to 250%, or 120% to 230%.

As a specific example, the polishing layer may have a hardness of 55 Shore D to 65 Shore D, a tensile strength of 10 N/mm$^2$ to 25 N/mm$^2$, and an elongation of 50% to 150%.

The polishing rate (or removal rate) of the polishing layer may be 3,000 Å/1 minute to 5,000 Å/1 minute, 3,000 Å/1 minute to 4,000 Å/1 minute, 4,000 Å/1 minute to 5,000 Å/1 minute, or 3,500 Å/1 minute to 4,500 Å/1 minute. The polishing rate may be an initial polishing rate immediately after the preparation of the polishing layer (i.e., immediately after the curing thereof).

In addition, the pad cut rate of the polishing layer may be 30 μm/hr to 60 μm/hr, 30 μm/hr to 50 μm/hr, 40 μm/hr to 60 μm/hr, or 40 μm/hr to 50 μm/hr.

The micropores are present as dispersed in the polyurethane-based resin.

The average diameter of the micropores may be 10 μm to 50 μm, 20 μm to 50 μm, 20 μm to 40 μm, 20 μm to 30 μm, 20 μm to 25 μm, or 30 μm to 50 μm.

In addition, the total area of the micropores may be 30% to 60%, 35% to 50%, or 35% to 43%, based on the total area of the polishing layer. In addition, the total volume of the micropores may be 30 to 70%, or 40 to 60%, based on the total volume of the polishing layer.

The polishing layer may have grooves on its surface for mechanical polishing. The grooves may have a depth, a width, and a spacing as desired for mechanical polishing, which are not particularly limited.

Swelling Ratio

It is possible to more effectively achieve the crosslinking density of a polyurethane-based resin, which is closely related to the characteristics of a polishing pad that affect its CMP performance, by adjusting the swelling ratio of the polishing layer in dimethyl sulfoxide (DMSO).

The polishing layer may have a swelling ratio in dimethyl sulfoxide of 100% to 250%, 100% to 200%, 100% to 150%, 150% to 250%, or 200% to 250%, based on the volume or weight of the polishing layer.

For example, the polishing layer may have a swelling ratio in dimethyl sulfoxide of 100% to 200%, 100% to 150%, or 150% to 200%, based on the volume of the polishing layer. In addition, the polishing layer may have a swelling ratio in dimethyl sulfoxide of 150% to 250%, 150% to 200%, or 200% to 250%, based on the weight of the polishing layer.

Specifically, the polishing layer may have, in dimethyl sulfoxide, a swelling ratio of 100% to 200% based on the volume of the polishing layer and a swelling ratio of 150% to 250% based on the weight of the polishing layer.

Support Layer

In addition, the polishing pad may further comprise a support layer disposed on one side of the polishing layer. The support layer serves to support the polishing layer and to absorb and disperse an impact applied to the polishing layer.

The support layer may comprise a nonwoven fabric or a suede. It may have a thickness of 0.5 mm to 1 mm and a hardness of 60 Asker C to 90 Asker C.

Adhesive Layer

The polishing pad may further comprise an adhesive layer interposed between the polishing layer and the support layer.

The adhesive layer may comprise a hot melt adhesive. The hot melt adhesive may be at least one selected from the group consisting of a polyurethane-based resin, a polyester resin, an ethylene-vinyl acetate resin, a polyamide resin, and a polyolefin resin, Specifically, the hot melt adhesive may be at least one selected from the group consisting of a polyurethane-based resin and a polyester resin.

[Process for Preparing a Polishing Pad]

The process for preparing a polishing pad according to an embodiment comprises reacting a diisocyanate, a polyol, and a multifunctional low-molecular-weight compound to prepare a urethane-based prepolymer; and mixing the urethane-based prepolymer with a curing agent and a foaming agent and curing the mixture to prepare a polishing layer, wherein the multifunctional low-molecular-weight compound has a molecular weight of 500 or less, and the polishing layer has a swelling ratio of 100% to 250% in dimethyl sulfoxide based on the volume or weight of the polishing layer.

Preparation of a Urethane-Based Prepolymer

First, a diisocyanate, a polyol, and a multifunctional low-molecular-weight compound are reacted to prepare a urethane-based prepolymer.

The urethane-based prepolymer may be prepared by a reaction of at least one diisocyanate monomer, at least one polyol, and at least one multifunctional low-molecular-weight compound as described above, in which the polymerization is terminated at an intermediate stage so that it has a relatively low molecular weight.

The step of preparing the urethane-based prepolymer may comprise a first reaction step of reacting the diisocyanate and the polyol; and a second reaction step of reacting to the product of the first reaction with the multifunctional low-molecular-weight compound.

In such event, the content of an unreacted diisocyanate in the product of the second reaction may be less than the content of an unreacted diisocyanate in the product of the first reaction.

In addition, the contents of respective compounds employed in the preparation of the urethane-based prepolymer and the reaction conditions may be adjusted to control the content of an unreacted diisocyanate in the prepolymer and the crosslinking density of the final polyurethane-based resin.

The urethane-based prepolymer may comprise the multifunctional low-molecular-weight compound in an amount of 0.1% to 10% by weight based on the weight of the urethane-based prepolymer.

In addition, the urethane-based prepolymer may comprise an unreacted diisocyanate in an amount of 0.1% by weight to 10% by weight based on the total weight of the diisocyanate.

In addition, an additional isocyanate, an alcohol, or other additives may be further added in the preparation of the prepolymer.

Preparation of a Polishing Layer

Thereafter, the urethane-based prepolymer is mixed with a curing agent and a foaming agent, and the mixture is cured to prepare a polishing layer.

The mixing may be carried out under the condition of 50° C. to 150° C. if necessary, it may be carried out under vacuum defoaming conditions.

In addition, the curing may be carried out under the temperature condition of 60° C. to 120° C. and the pressure condition of 50 kg/m$^2$ to 200 kg/m$^2$.

The curing agent may be at least one of an amine compound and an alcohol compound, Specifically, the curing agent may comprise at least one compound selected from the group consisting of an aromatic amine, an aliphatic amine, an aromatic alcohol, and an aliphatic alcohol. The curing agent may have, for example, two or more reactive groups. In addition, the molecular weight of the curing agent may be, for example, greater than 50, greater than 100, greater than 150, greater than 200, greater than 300, or to greater than 500. Specifically, the curing agent may be at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, polypropylenediamine, and polypropylenetriamine.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the NCO group in the urethane-based prepolymer and the number of moles of the reactive groups (e.g., amine group, alcohol group, and the like) in the curing agent, Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

The foaming agent is not particularly limited as long as it is commonly used for forming voids in a polishing pad.

For example, the foaming agent may be at least one selected from a solid phase foaming agent having a hollow structure, a liquid phase foaming agent using a volatile liquid, and an inert gas.

The solid phase foaming agent may be thermally expanded microcapsules. They may be obtained by thermally expanding thermally expandable microcapsules. Since the thermally expanded microcapsules in a structure of an expanded micro-balloons have a uniform particle diameter, they have the advantage that the diameter of pores can be uniformly controlled. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1 part by weight to 2.0 parts by weight based on 100 parts by weight of the urethane-based prepolymer, Specifically, the solid phase foaming agent may be employed in an amount of 0.3 parts by weight to 1.5 parts by weight, or 0.5 parts by weight to 1.0 parts by weight, based on 100 parts by weight of the urethane-based prepolymer.

The kind of the inert gas is not particularly limited as long as it is a gas that does not participate in the reaction between the urethane-based prepolymer and the curing agent. For example, the inert gas may be at least one selected from the group consisting of nitrogen gas ($N_2$), carbon dioxide ($CO_2$), argon gas (Ar), and helium gas (He). Specifically, the inert gas may be nitrogen gas ($N_2$) or carbon dioxide ($CO_2$).

The inert gas may be fed in a volume of 10% to 30% based on the total volume of the polyurethane-based resin composition. Specifically, the inert gas may be fed in a volume of 15% to 30% based on the total volume of the polyurethane-based resin composition.

Thereafter, the process may further comprise the steps of cutting the surface of the polishing layer thus obtained, machining grooves on the surface thereof, bonding with the lower part, inspection, packaging, and the like.

These steps may be carried out in a conventional manner for preparing a polishing pad.

[Process for Preparing a Semiconductor Device]

The process for preparing a semiconductor device according to an embodiment comprises polishing the surface of a semiconductor substrate using the polishing pad according to the embodiment.

That is, the process for preparing a semiconductor device according to an embodiment comprises polishing the surface of a semiconductor substrate using a polishing pad, wherein the polishing pad comprises a polishing layer comprising a polyurethane-based resin, the polyurethane-based resin comprises a diisocyanate, a polyol, and a multifunctional low-molecular-weight compound as polymerization units, the multifunctional low-molecular-weight compound has a molecular weight of 500 or m less, and the polishing layer has a swelling ratio of 1.00% to 250% in dimethyl sulfoxide based on the volume or weight of the polishing layer.

Specifically, once the polishing pad according to an embodiment is mounted on a platen, a semiconductor substrate is disposed on the polishing pad. In such event, the surface of the semiconductor substrate is in direct contact with the polishing surface of the polishing pad. A polishing slurry may be sprayed on the polishing pad for polishing. Thereafter, the semiconductor substrate and the polishing pad rotate relatively to each other, so that the surface of the semiconductor substrate is polished.

MODE FOR THE INVENTION

Hereinafter, the present invention is explained in detail by the following Examples. However, the scope of the present invention is not limited thereto.

EXAMPLES AND COMPARATIVE EXAMPLE

Step (1) Preparation of a Prepolymer

A four-necked flask was charged with toluene diisocyanate (TDI), dicyclohexylmethane diisocyanate (H12MDI), polytetramethylene ether glycol (PTMEG), and diethylene glycol (DEG), followed by a reaction thereof at 80° C. for 3 hours. Thereafter, a multifunctional low-molecular-weight compound was added in an amount shown in Table 1 below, followed by a reaction thereof at 80° C. for 2 hours to prepare a urethane-based prepolymer. The NCO % and the contents of unreacted TDI of the prepolymer are shown in Table 1 below.

Step (2) Preparation of a Polishing Pad

A casting machine equipped with tanks and feeding lines for a prepolymer, a curing agent, an inert gas, and a foaming agent was provided. The urethane-based prepolymer prepared above, a curing agent (bis(4-amino-3-chlorophenyl) methane, Ishihara), an inert gas ($N_2$), a liquid phase foaming agent (FC3283, 3M), a solid phase foaming agent (Akzonobel); and a silicone-based surfactant (Evonik) were charged to each tank. The raw materials were stirred while they were fed to the mixing head at constant rates through the respective feeding lines. In such event, the prepolymer and the curing agent were fed at an equivalent ratio of 1:1 and at a total rate of 10 kg/min.

A mold (1,000 mm×1,000 mm×3 mm) was prepared and preheated at a temperature of 80° C. The mixed raw materials prepared above were injected into the mold and reacted to obtain a molded article in the form of a solid cake. Thereafter, the top and bottom of the molded article were each ground to obtain a polishing layer.

Specific process conditions and the compositions of the prepolymers are summarized in the table below.

TABLE 1

| | Item | Ex. 1 | Ex. 2 | Ex. 3 | C. Ex. 1 |
|---|---|---|---|---|---|
| Polishing layer | Multifunctional low-molecular-weight compound | Glycerin | Glycerin | Trimethylol propane | — |
| | Added amount of multifunctional low-molecular-weight compound (based on the weight of prepolymer) | 1% by weight | 5% by weight | 1% by weight | — |

TABLE 1-continued

| Item | Ex. 1 | Ex. 2 | Ex. 3 | C. Ex. 1 |
|---|---|---|---|---|
| NCO % of prepolymer | 9% by weight | 9% by weight | 9% by weight | 9% by weight |
| Content of unreacted NCO group in prepolymer (based on total amount of TDIs) | 4.96% by weight | 4.85% by weight | 4.88% by weight | 6.54% by weight |
| Casting mold | Single layer | Single layer | Single layer | Single layer |
| Casting, cutting, and grooving | Sequential | Sequential | Sequential | Sequential |
| Prepolymer (part by weight) | 100 | 100 | 100 | 100 |
| Surfactant (part by weight) | 0.2 to 1.5 | 0.2 to 1.5 | 0.2 to 1.5 | 0.2 to 1.5 |
| Solid phase foaming agent (part by weight) | 0.5 to 1.5 | 0.5 to 1.5 | 0.5 to 1.5 | 0.5 to 1.5 |
| Inert gas feeding rate (l/min) | 0.5 to 1.5 | 0.5 to 1.5 | 0.5 to 1.5 | 0.5 to 1.5 |

Test Example

The urethane-based prepolymers or the polishing pads obtained in the Examples and Comparative Example were tested for the following items.
(1) Content of Unreacted TDI The composition of the prepolymer was analyzed to determine the content of unreacted TDI. 5 mg of a urethane-based prepolymer sample was first dissolved in $CDCl_3$ and subjected to $^1$H-NMR and $^{13}$C-NMR analyses using a nuclear magnetic resonance (NMR) device (JEOL 500 MHz, 90° pulse) at room temperature. The peaks of reacted or unreacted methyl groups of TDI in the NMR data thus obtained were integrated, whereby the content of reacted or unreacted TDI monomers in the urethane-based prepolymer was calculated.

Specifically, when the weight of 2,4-TDI (hereinafter referred to as "4-reacted 2,4-TDI") in which only the NCO group located at the 4-position among the two NCO groups had been reacted with a polyol is 100 parts by weight, the respective weights of 2,4-TDI (hereinafter referred to as "2,4-reacted 2,4-TDI") in which both NCO groups had been reacted with a polyol to form a chain, 2,6-TDI (hereinafter referred to as "unreacted 2,6-TDI") in which no NCO group had been reacted with a polyol, and 2,6-TDI (hereinafter referred to as "2-reacted 2,6-TDI") in which only NCO group located at the 2-position or the 6-position of the two NCO groups had been reacted with a polyol were calculated. (In addition, 2,4-TDI in which the NCO group located at the 2-position alone had been reacted and 2,6-TDI in which both NCO groups had been reacted were hardly detected.) The results are shown in the tables below.

(2) Swelling Ratio

The polishing layer before the formation of grooves was cut into a diameter of 20 mm and a thickness of 2 mm to prepare a sample. The precise size of the sample thus prepared was measured using a Vernier caliper. The sample was weighed using a valid scale with four decimal places. A 250-ml beaker was charged with 50 ml of a solvent (DMSO), and the sample was placed therein and stored at room temperature (20 to 25° C.) for 21 hours. Thereafter, the sample was taken out, and the solvent remaining on the surface thereof was wiped 2 to 3 times using gauze. Then, the sample was measured for the size and weight.

The swelling ratio (%) was calculated by the following equation.

Swelling ratio(%,volume)=(volume after storage in solvent−initial volume)×volume after storage in solvent)/initial volume×100

Swelling ratio(%,weight)=(weight after storage in solvent−initial weight)/initial weight×100

(3) Hardness

Each sample was cut to 5 cm×5 cm (thickness: 2 mm) and stored at room temperature and a temperature of 30° C., 50° C., and 70° C., respectively, for 12 hours to measure the Shore D hardness and Asker C hardness using a hardness tester.

(4) Specific Gravity

Each sample was cut to 2 cm×5 cm (thickness: 2 mm) and stored at a temperature of 25° C. for 12 hours to measure the specific gravity using a gravimeter.

(5) Tensile Strength

Each sample was cut to 4 cm×1 cm (thickness: 2 mm). The ultimate strength immediately before the fracture was measured while the sample was tested at a rate of 50 mm/min using a universal testing machine (UTM).

TABLE 2

| | Item | Ex. 1 | Ex. 2 | Ex. 3 | C. Ex. 1 |
|---|---|---|---|---|---|
| Content (parts by weight) | 4-reacted 2,4-TDI | 100.00 | 100.00 | 100.00 | 100.00 |
| | 2,4-reacted 2,4-TDI | 31.94 | 37.60 | 31.84 | 33.06 |
| | Unreacted 2,6-TDI | 7.95 | 8.01 | 7.98 | 10.88 |
| | 2-reacted 2,6-TDI | 20.38 | 19.57 | 20.22 | 22.31 |
| | Total content of TDI | 160.27 | 165.18 | 160.04 | 166.25 |
| | Total content of reacted TDI | 152.32 | 157.17 | 152.06 | 155.37 |
| Content (% by weight) (Based on total content of TDI) | TDI with both ends reacted | 19.93 | 22.76 | 19.90 | 19.89 |
| | TDI with one end reacted | 75.11 | 72.39 | 75.12 | 73.57 |
| | 2,4-TDI with one end reacted | 62.39 | 60.54 | 62.48 | 60.15 |
| | 2,6-TDI with one end reacted | 12.72 | 11.85 | 12.63 | 13.42 |
| | Unreacted TDI | 4.96 | 4.85 | 4.99 | 6.54 |

(6) Elongation

Each sample was cut to 4 cm×1 cm (thickness: 2 mm). The maximum deformation immediately before the fracture was measured while the sample was tested at a rate of 50 mm/min using a universal testing machine (UM The ratio of the maximum deformation to the initial length was expressed in percent (%).

(7) Modulus

Each sample was cut to 4 cm×1 cm (thickness: 2 mm). The modulus was measured as the slope between the elongation at 70% and the elongation at 20% while the sample was tested at a rate of 50 mm/min using a universal testing machine (UTM).

(8) Polishing Rate

The initial polishing rate immediately after the polishing pad had been prepared was measured as follows. A silicon wafer having a diameter of 300 mm was deposited with silicon oxide by a CVD process. The polishing pad was mounted on a CMP machine, and the silicon wafer was set with the silicon oxide layer thereof facing the polishing surface of the polishing pad. The silicon oxide layer was polished under a polishing load of 4.0 psi while it was rotated at a speed of 150 rpm for 60 seconds and a calcined silica slurry was supplied onto the polishing pad at a rate of 250 ml/min, Upon completion of the polishing, the silicon wafer was detached from the carrier, mounted in a spin dryer, washed with distilled water, and then dried with nitrogen for 15 seconds. The changes in the film thickness of the dried silicon wafer before and after the polishing were measured using a spectral reflectometer type thickness measuring instrument (SI-F80R, Keyence). The polishing rate was calculated using the following Equation.

Polishing rate (Å/min)=difference in thickness before and after polishing (Å)/polishing time (min)

(9) Pad Cut Rate

Each polishing pad was pre-conditioned with deionized water for 10 minutes and then conditioned while deionized water was sprayed for 1 hour. The change in thickness of the polishing pad during the conditioning was measured to calculate the pad cut rate. The equipment used for conditioning was CTS AP-300HM. The conditioning pressure was 6 lbf, the rotational speed was 100 to 110 rpm, and the disk used for conditioning was CI-45 of Sasol.

The results are shown in the Table below.

As shown in the above table, the polishing pads of Examples 1 to 3 had a smaller swelling ratio than that of the polishing pad of Comparative Example 1 and were excellent in hardness, tensile strength, elongation, and polishing rate.

The invention claimed is:

1. A polishing pad, which comprises a polishing layer comprising a porous polyurethane-based resin,
   wherein the porous polyurethane-based resin comprises a diisocyanate, a polyol, and a multifunctional low-molecular-weight compound as polymerization units, the multifunctional low-molecular-weight compound has a molecular weight of 500 or less, and the polishing layer has a swelling ratio of 100% to 250% in dimethyl sulfoxide based on the volume or weight of the polishing layer,
   wherein the polishing layer has a hardness of 55 Shore D to 65 Shore D and a tensile strength of 10 N/mm$^2$ to 25 N/mm$^2$,
   wherein the porous polyurethane-based resin is one obtained by curing a urethane-based prepolymer,
   wherein the urethane-based prepolymer comprises the multifunctional low-molecular-weight compound in an amount of 0.1% to 2% by weight based on the weight of the urethane-based prepolymer,
   wherein the urethane-based prepolymer comprises an unreacted diisocyanate in an amount of 0.1% by weight to 5% by weight based on the total weight of the diisocyanate,
   wherein the diisocyanate comprises toluene diisocyanate (TDI),
   wherein the porous polyurethane-based resin further comprises 4,4'-meth-ylenebis(2-chloroaniline) (MOCA) as a curing agent, and a foaming agent, wherein the foaming agent comprises a first foaming agent that is a solid phase foaming agent having a hollow structure and a second foaming agent that is an inert gas foaming agent,
   wherein a polishing rate of the polishing layer is 3,000 Å/1 minute to 5,000 Å/1 minute,
   wherein the solid phase foaming agent is employed in an amount of 0.5 part by weight to 1.5 parts by weight based on 100 parts by weight of the urethane-based prepolymer,

TABLE 3

| Item | Evaluation | Ex. 1 | Ex. 2 | Ex. 3 | C. Ex. 1 |
|---|---|---|---|---|---|
| Polishing layer | Swelling ratio in DMSO (based on volume) | 131% | 119% | 127% | 207% |
| | Swelling ratio in DMSO (based on weight) | 188% | 167% | 190% | 268% |
| | Thickness (mm) | 2 | 2 | 2 | 2 |
| | Hardness (Shore D, room temp.) | 58.3 | 59.3 | 58.1 | 57.8 |
| | Specific gravity (g/cc) | 0.78 | 0.78 | 0.78 | 0.78 |
| | Tensile strength (N/mm$^2$) | 22.3 | 23.2 | 22.3 | 21 |
| | Elongation (%) | 107.5 | 98.2 | 109.1 | 113.7 |
| | Modulus (kgf/cm$^2$) | 95 | 128 | 101 | 46 |
| | Hardness (Shore D, 30° C.) | 58.1 | 59.1 | 57.9 | 57.0 |
| | Hardness (Shore D, 50° C.) | 56.7 | 57.7 | 55.9 | 55.6 |
| | Hardness (Shore D, 70° C.) | 50 | 52 | 50.1 | 49.6 |
| | Polishing rate (Å/min) | 3,256 | 3,612 | 3,233 | 2,703 |
| | Pad cut rate (μm/hr) | 43.3 | 39.3 | 42.8 | 51.3 |
| Support layer | Type | Nonwoven fabric | Nonwoven fabric | Nonwoven fabric | Nonwoven fabric |
| | Thickness (mm) | 1.1 | 1.1 | 1.1 | 1.1 |
| | Hardness (Asker C) | 70 | 70 | 70 | 70 |
| Laminated pad | Thickness (mm) | 3.32 | 3.32 | 3.32 | 3.32 |
| | Compression rate (%) | 1.05 | 1.05 | 1.05 | 1.05 | wherein the urethane-based prepolymer comprises an unreacted NCO group in an amount of 5% by weight to 10% by weight based on the weight of the urethane-based prepolymer, wherein the urethane-based prepolymer comprises the diisocyanate, the polyol, and the multifunctional low-molecular-weight compound as polymerization units, wherein the weight average molecular weight of the urethane-based prepolymer is 500 to 5,000, and wherein the multifunctional low-molecular-weight compound is selected from the group consisting of glycerin, trimethylolpropane, ethylenediamine, diethanolamine, diethylenetriamine, triethylenetetraamine, and dihydrogen monoxide.

2. The polishing pad of claim 1, wherein the porous polyurethane-based resin comprises the multifunctional low-molecular-weight compound reacted with the diisocyanate; and the polymerization chains crosslinked by the multifunctional low-molecular-weight compound.

3. The polishing pad of claim 1, wherein the multifunctional low-molecular-weight compound comprises 3 to 10 functional groups at the terminal, and the functional group is at least one selected from the group consisting of a hydroxyl group, an amine group, and an epoxy group.

4. The polishing pad of claim 1, wherein the polishing layer has, in dimethyl sulfoxide, a swelling ratio of 100% to 200% based on the volume of the polishing layer and a swelling ratio of 150% to 250% based on the weight of the polishing layer.

5. The polishing pad of claim 1, wherein the polishing layer has an elongation of 50% to 150%.

* * * * *